(12) United States Patent
Barr et al.

(10) Patent No.: US 8,460,474 B2
(45) Date of Patent: Jun. 11, 2013

(54) METHOD OF CLEANING SEMICONDUCTOR WAFERS

(75) Inventors: Robert K. Barr, Shrewsbury, MA (US); Raymond Chan, Westborough, MA (US); Matthew L. Moynihan, Sterling, MA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 522 days.

(21) Appl. No.: 12/657,095

(22) Filed: Jan. 13, 2010

(65) Prior Publication Data

US 2010/0248494 A1  Sep. 30, 2010

Related U.S. Application Data

(60) Provisional application No. 61/205,020, filed on Jan. 14, 2009.

(51) Int. Cl.
*H01L 21/465* (2006.01)

(52) U.S. Cl.
USPC ........ 134/3; 134/26; 134/27; 134/28; 134/29; 438/745; 257/E21.485

(58) Field of Classification Search
None
See application file for complete search history.

(56) References Cited

U.S. PATENT DOCUMENTS

| | | | | |
|---|---|---|---|---|
| 4,011,389 A * | 3/1977 | Langdon | ......................... | 536/4.1 |
| 4,581,102 A * | 4/1986 | Brock | ........................... | 216/107 |
| 4,675,125 A * | 6/1987 | Sturwold | ........................ | 510/264 |
| 5,279,677 A * | 1/1994 | Das | .................................... | 134/3 |
| 5,728,667 A * | 3/1998 | Richter | .......................... | 510/235 |
| 5,855,811 A * | 1/1999 | Grieger et al. | ................. | 252/79.3 |
| 6,044,851 A * | 4/2000 | Grieger et al. | .................. | 134/1.3 |
| 6,068,879 A * | 5/2000 | Pasch | ............................... | 216/18 |
| 6,239,039 B1 * | 5/2001 | Nihonmatsu et al. | .......... | 438/749 |
| 6,274,059 B1 * | 8/2001 | Krusell et al. | ................... | 216/88 |
| 6,432,837 B2 * | 8/2002 | Nihonmatsu et al. | .......... | 438/749 |
| 6,465,403 B1 * | 10/2002 | Skee | .............................. | 510/175 |
| 6,468,951 B1 * | 10/2002 | Grieger et al. | ................. | 510/175 |
| 6,709,316 B1 * | 3/2004 | Sun et al. | ..................... | 451/41 |
| 6,953,041 B2 * | 10/2005 | DeYoung et al. | .............. | 134/1.1 |
| 7,279,119 B2 * | 10/2007 | Hellring et al. | ............... | 252/79.1 |
| 7,285,492 B2 * | 10/2007 | Wang et al. | .................... | 438/674 |
| 7,514,363 B2 * | 4/2009 | Banerjee et al. | .............. | 438/692 |
| 7,611,588 B2 * | 11/2009 | Peitersen et al. | ................. | 134/26 |
| 8,070,882 B2 * | 12/2011 | Schwab et al. | ..................... | 134/2 |
| 8,092,707 B2 * | 1/2012 | Hardy et al. | ................... | 252/79.1 |
| 8,114,178 B2 * | 2/2012 | Izumi et al. | ..................... | 51/308 |
| 2001/0052351 A1 * | 12/2001 | Brown et al. | ..................... | 134/2 |
| 2004/0055704 A1 * | 3/2004 | Bunyard et al. | ............... | 156/305 |
| 2004/0067649 A1 * | 4/2004 | Hellring et al. | ............... | 438/689 |
| 2004/0071873 A1 * | 4/2004 | DeYoung et al. | ........... | 427/248.1 |
| 2004/0248752 A1 * | 12/2004 | Jung et al. | ...................... | 510/175 |
| 2005/0176613 A1 * | 8/2005 | Wai Cheung et al. | ........ | 510/383 |
| 2005/0245080 A1 * | 11/2005 | Wang et al. | .................... | 438/678 |
| 2006/0046490 A1 * | 3/2006 | Banerjee et al. | .............. | 438/692 |
| 2006/0112972 A1 * | 6/2006 | Peitersen et al. | ................. | 134/26 |
| 2006/0172912 A1 * | 8/2006 | Burt et al. | ...................... | 510/383 |
| 2008/0000776 A1 * | 1/2008 | Wang et al. | ...................... | 205/80 |
| 2008/0026583 A1 * | 1/2008 | Hardy et al. | ................... | 438/693 |
| 2008/0111101 A1 * | 5/2008 | Keleher et al. | ............... | 252/79.1 |
| 2008/0311750 A1 * | 12/2008 | Izumi et al. | ................... | 438/693 |
| 2009/0107520 A1 * | 4/2009 | Lee et al. | ........................... | 134/2 |
| 2009/0120457 A1 * | 5/2009 | Naghshineh et al. | ............. | 134/2 |
| 2009/0130849 A1 * | 5/2009 | Lee | .............................. | 438/693 |
| 2009/0131295 A1 * | 5/2009 | Cui | ................................. | 510/176 |
| 2009/0133716 A1 * | 5/2009 | Lee | .................................. | 134/3 |
| 2009/0137191 A1 * | 5/2009 | Lee | ................................. | 451/36 |
| 2009/0145457 A1 * | 6/2009 | Schwab et al. | ...................... | 134/4 |
| 2009/0261291 A1 * | 10/2009 | Banerjee et al. | ............. | 252/79.1 |
| 2009/0318063 A1 * | 12/2009 | Misra | .............................. | 451/28 |
| 2010/0105154 A1 * | 4/2010 | Wang et al. | ..................... | 438/15 |
| 2010/0105595 A1 * | 4/2010 | Lee | ................................. | 510/176 |
| 2010/0248494 A1 * | 9/2010 | Barr et al. | ..................... | 438/745 |
| 2011/0151671 A1 * | 6/2011 | Barr et al. | ..................... | 438/695 |

FOREIGN PATENT DOCUMENTS

JP  2006344765 A  12/2006

OTHER PUBLICATIONS

Wikipedia; "pH"; http://en.wikipedia.org/wiki/PH; downloaded Oct. 17, 2012.
Wikipedia; "Glucose"; http://en.wikipedia.org/wiki/Glucose; downloaded Oct. 17, 2012.

* cited by examiner

*Primary Examiner* — Allan Olsen
(74) *Attorney, Agent, or Firm* — John J. Piskorski

(57) ABSTRACT

A method of cleaning semiconductor wafers using an acid cleaner followed by an alkaline cleaner to clean contaminants from the materials is provided. The acid cleaner removes substantially all of the metal contaminants while the alkaline cleaner removes substantially all of the non-metal contaminants, such as organics and particulate material.

8 Claims, No Drawings

METHOD OF CLEANING SEMICONDUCTOR WAFERS

The present invention is directed to a method of cleaning semiconductor wafers of contaminants. More specifically, the present invention is directed to a method of cleaning semiconductor wafers of contaminants using an acid cleaner followed by an alkaline cleaner.

Conventionally, semiconductor wafers may be fabricated by the following steps:
(1) a semiconductor ingot is sliced by an inner diameter saw to obtain a wafer;
(2) the wafer is washed with water to remove contaminants; and
(3) the wafer is then cleaned to remove impurities including heavy metal and particles and then dried.

When the semiconductor wafer is used in the manufacture of solar cells, a surface of the wafer is roughened or textured to reduce light reflectance. A solar cell is a device that converts light energy incident on its surface such as sunlight into electric energy. Various approaches have been attempted to increase the absorbance of energy. One of such approaches is to reduce reflectance of light incident on the surface of the solar cell. Reducing light reflectance from the surface allows the conversion efficiency into electric energy to be improved. Typically texturing is done by etching a surface of the semiconductor wafer in a predetermined condition with an alkaline aqueous solution such as sodium hydroxide.

Prior to texturing, the semiconductor ingot is sliced to a desired size and shape using an inner diameter saw as mentioned above. During the cutting process metal from the saw such as iron, copper, lead and zinc contaminate the surface of the sliced semiconductor. In addition, slurries which are applied to the saw during the cutting process also contaminate the semiconductor. By cutting using a slurry that is either a mixture of free abrasive particles, such as silicon carbide, and an organic material or oil base such as a mineral oil, or a mixture of free abrasive particles and an aqueous solution base such as polyethylene glycol, the effects of improving cuttability, reducing residual processing distortion, suppressing process stress and suppressing cutting heat can be enhanced. Further, by the addition of alkaline hydroxides to such slurries process stress (residual distortion) produced by cutting is eliminated thus to cut low-distortion wafers. Such a method is disclosed in U.S. Pat. No. 6,568,384. Such abrasive particles and organic materials also contaminant the semiconductor wafer and may compromise the texturing process thus to reduce the desired absorbance of the final solar cell article. Accordingly, removal of such surface contaminants is important prior to texturing.

Conventional methods of cleaning the semiconductor wafer prior to texturing, such as with water and alkaline cleaners, have not been found to be satisfactory to many workers in the semiconductor industry. Metals such as iron and copper are difficult to remove, in particular iron. If iron is not removed from the wafer, iron oxide, as indicated by black spots, forms on the wafer compromising the optimum absorbance of the surface of the wafer. Some alkaline cleaners have been found to remove organic materials well but not metals. Further, in addition to cleaning organics from the wafer, the alkaline cleaners have an etching action, i.e., partial texturing. Partial texturing occurs when hydroxide reacts with silicon to form soluble silicates that dissolve into the aqueous solution. Ideally etching of silicon is minimized during cleaning (zero etching is desired). This partial texturing is noticeable as white spots. This is particularly common when the semiconductor is a monocrystalline wafer. Accordingly, there is a need in the semiconductor industry for an improved method of removing contaminants from a semiconductor wafer prior to texturing to improve the overall performance and appearance of the semiconductor wafer used in solar cells; and minimize contamination of the wafer with conducting metals which may reduce the efficiency of the solar cells.

In one aspect a method includes, in sequence, the following:
a) applying a first composition including one or more acids chosen from polycarboxylic acids and inorganic acids to a semiconductor wafer; and
b) applying a second composition including one or more alkaline compounds to the semiconductor wafer to remove metals, organics and abrasives from the wafer.

In another aspect a method includes, in sequence, the following:
a) applying a first composition including one or more acids chosen from polycarboxylic acids and inorganic acids to a semiconductor wafer;
b) applying a second composition including one or more alkaline compounds to the semiconductor wafer; and
c) applying a second acid composition including one or more acids chosen from polycarboxylic acids and inorganic acids to the semiconductor wafer to remove metals, organics and abrasives from the wafer.

The method is used to remove contaminants on a semiconductor wafer after it has been cut from an ingot. The saws used in the cutting process contaminate the surface of the semiconductor with metals such as iron, copper, lead and zinc. The slurries used during the cutting process contaminate the surface with organics and abrasive particles. Such contaminants are undesirable since they may compromise appearance and efficiency of the semiconductor. Minimizing metal contamination is desired when the semiconductor wafer is used in the manufacture of a solar cell. Such contamination increases the probability that metal contaminants may be incorporated into the silicon matrix resulting in poor conductivity and an over all drop in solar cell efficiency. In addition to cleaning metals, organics and abrasive particles from semiconductor wafers, the method is compatible with ultrasonic cleaning processes, low foaming, environmentally friendly, easy to rinse from semiconductor wafers and flexible to customize to customer processes.

As used throughout this specification, the following abbreviations have the following meaning, unless the context indicates otherwise: ° C.=degrees Centigrade; gm=gram; L=liter; mL=milliliter; cm=centimeters; ppm=parts per million; ppb=parts per billion; wt %=weight percent. All numerical ranges are inclusive and combinable in any order, except where it is logical that such numerical ranges are construed to add up to 100%.

Semiconductor wafers may be cut from ingots using any conventional method known in the art. In general, ingots are cut using conventional wire saw apparatus. An example of such a wire saw apparatus is disclosed and illustrated in U.S. Pat. No. 6,568,384. The wire used in the saw is such that abrasive particles such as carborundum, diamond, silicon carbide or other abrasive particles having a size of #100 to #6000 adhere to it. A bonding agent may be applied to the wire to cause the abrasives to adhere to it.

Slurries used in the cutting process are a mixture of free abrasive particles and an oil base or aqueous solution base. The oil base used is a mineral oil in which a dispersant and thickener have been mixed. The aqueous solution base used includes various additives added to 30% to 80% water or polyethylene glycol. Silicon carbide, green silicon carbide or various metal and oxide grits may be used as the free abrasive particles. Typically silicon carbide having particles sizes of #600 to #1000 is used.

The specific formulations and amounts of components in slurries may vary as determined by preferences of workers. Typically, the slurry is a mixture of a solution of mineral oil as the base to which silicon carbide is added. The mixture ratio may range from base:silicon carbide=1:1 to 1:1.3. An aqueous base slurry may include silicon carbide added to 30% to 80% water or polyethylene glycol in a mixture of base:silicon carbide of 0.8 to 0.9:1.

The process of cutting the ingot to form a semiconductor wafer results in many contaminants on the surface of the wafer. Metals from the wire saw such as iron, copper, lead and zinc as well as the organic materials, such as mineral oil and polyethylene glycol and abrasive particles as well as other additives which are conventionally included in slurries coat the surfaces of the wafer. Immediately prior to any further processing steps the semiconductor wafer is cleaned using an aqueous composition including one or more acids chosen from polycarboxylic acids and inorganic acids. Immediately following the application of the aqueous acid composition the semiconductor wafer is then cleaned with an aqueous alkaline solution. In the first step of cleaning the semiconductor wafer using the aqueous composition including the one or more acids chosen from polycarboxylic acids and inorganic acids, substantially all of the metal contaminants are removed from the wafer. In the second step of cleaning the semiconductor wafer using the aqueous alkaline solution, substantially all of the organic materials and abrasives are removed from the wafer. In addition to removing organic materials and abrasives, the aqueous alkaline composition may simultaneously micro-etch the wafer surface. Optionally, a third cleaning step or second aqueous acid composition may be applied to the wafer immediately following the alkaline cleaning step to remove any remaining contaminants.

The cleaning compositions may be applied to the semiconductor wafer by any suitable method known in the art. The semiconductor wafer may be immersed in the cleaning compositions, the cleaning compositions may be sprayed on the semiconductor wafer or the cleaning compositions may be used in conventional ultrasonic cleaning processes. The cleaning compositions may be applied at temperature ranges from at least room temperature and higher, typically from room temperature to 100° C. Optionally, the semiconductor wafer may be rinsed with deionized water. After the semiconductor wafer is cleaned of contaminants, it is processed using conventional methods for use in manufacture of solar cells.

The cleaning method is suitable to clean semiconductor wafers in general and wafers used in the manufacture of solar cells. Semiconductor wafers may be crystalline or amorphous. The crystalline type may be monocrystalline or polycrystalline. In the manufacture of solar cells, the cleaning method is used prior to texturing a surface of a semiconductor. Numerous methods and compositions for texturing are well known in the solar cell industry. Such texturing improves the reflectance of incident light on the wafer surface and improves the overall efficiency of the solar cell. A clean surface is important in achieving optimum appearance and efficiency of solar cells. Any contaminants on the surface of the wafer may ultimately compromise the performance of the solar cell. Accordingly, both the acid and alkaline cleaning compositions do not include any components which interfere with the performance of the wafers in solar cells and which may provide a source of metal contamination. As mentioned above, the method removes substantially all of the metals from the wafer surface. Iron and copper are especially difficult to remove using water. Iron in particular is problematic because it forms iron oxide on the wafer surface. Once iron oxide forms on the wafer surface it is very difficult to remove and compromises the texturing process and the overall incident light absorbance of the wafer. Further, if substantial amounts of iron remain on the wafer surface during texturing, the black spots characteristic of iron oxide formation become worse. The first step of the cleaning method using the aqueous acid composition including one or more acids chosen from polycarboxylic acids and inorganic acids removes substantially all of the metal contaminants including iron, thus preventing or reducing iron oxide formation on the wafer. Additionally, initial cleaning of the wafer surface with the aqueous acid composition to remove metal contaminants instead of a conventional alkaline process eliminates the undesired partial texturing, as indicated by white spots on the surface of the wafer. The aqueous acid cleaning step typically reduces the overall metal contamination to levels in the ppb range. Typically, after the aqueous acid cleaning step is done the metal contaminants may range from 0 ppb to 10 ppb.

The acids may be included in the aqueous acid cleaning composition in amounts of 0.05 wt % to 20 wt %, or such as from 0.5 wt % to 15 wt %, or such as from 1 wt % to 10 wt %. Polycarboxylic acids include, but are not limited to, aliphatic polycarboxylic acids such as, but not limited to, dicarboxylic acids such as, but not limited to, oxalic acid, malonic acid, succinic acid, glutaric acid, adipic acid, pimelic acid, maleic acid, fumaric acid and phthalic acid, tricarboxylic acids such as, but not limited to, trimellitic acid tricarballylic acid and oxypolycarboxylic acids such as, but not limited to, oxydicarboxylic acids such as, but not limited to, tartaric acid, malic acid and oxytricarboxylic acids such as, but not limited to, citric acid. Typically, dicarboxylic acids, oxydicarboxylic acids and oxytricarboxylic acids are used in the aqueous acid cleaning compositions. More typically, dicarboxylic acids and oxytricarboxylic acids are used. Most typically, oxalic acid and citric acid are used.

Inorganic acids include, but are not limited to, hydrochloric acid, nitric acid and sulfuric acid. When an inorganic acid is used in the cleaning compositions, typically the acid is hydrochloric acid.

Application of the aqueous alkaline cleaning composition immediately following application of the aqueous acid composition removes substantially all of the organic materials, abrasives and conventional additives used in slurries. Such contaminants also compromise the appearance and efficiency of any solar cell where the wafer is used. Alkaline compounds are included in the aqueous alkaline compositions in amounts of 0.2 wt % to 30 wt %, or such as from 0.5 wt % to 10 wt %. Alkaline compounds which are included in the aqueous alkaline composition include, but are not limited to, sodium carbonate, potassium carbonate, sodium bicarbonate, sodium hydroxide, potassium hydroxide, sodium metasilicate, triethanolamine, tetra-methyl ammonium hydroxide (TMAH) and mixtures thereof. Typically, the alkaline compounds used are sodium carbonate or sodium hydroxide or mixtures thereof. When sodium hydroxide is included in the aqueous alkaline cleaner, in addition to removing contaminants, it also micro-etches the wafer surface. Micro-etching means that the surface roughness of the semiconductor wafer does not exceed 1 μm (peak-to-valley height).

In addition to one or more acids in the aqueous acid composition and one or more alkaline compounds in the aqueous base composition, one or more surfactants may be added to the cleaning compositions. Such surfactants may be nonionic, anionic, cationic, amphoteric and gemini (dimeric) surfactants. Typically, the surfactants used in the cleaning compositions are nonionic. The surfactants assist in removing organic materials and abrasive particles as well as metals which may have been missed by the aqueous acid cleaning composition. Surfactants are included in the cleaning compositions in amounts of 0.001 wt % to 1 wt %, or such as from 0.0025 wt % to 0.5 wt %.

One type of surfactant which may be used includes, but is not limited to, polyols. Such polyols include, but are not limited to, diols (e.g. ethylene glycol, propylene glycol, etc.), triols (e.g. glycerol, butanetriol, etc.), tetraols (e.g. erythritol, threitol, pentaerythritol, etc.), pentaols (e.g. xylitol, arabitol, ribitol, etc.), hexaols (e.g. sorbitols, mannitol, galactitol, etc.), aldo- or keto-triose, -tetrose, -pentose, -hexose, -heptose, etc. (e.g. glyceraldehyde, erythrose, threose, ribose, arabinose, fructose, sorbose, glucose, galactose, mannose), di-, tri-, oligo- or polysaccharides, such as sucrose, cellobiose, isomaltose, maltose, maltotriose, starch, cellulose, hemicellulose, and the like. Additionally, non-reducing sugars derived from mono-, di-, tri-, oligo- or polysaccharides, e.g. alkyl glycosides like methyl-glycoside, other sugars such as trehalose, isotrehalose, raffinose, stachyose, etc.) may also be used. Other polyols include aldonic acid, aldonic acid salts (e.g. methyl gluconate, sodium gluconate, etc.), aldonic lactones (e.g. gluconolactone, etc.), aldaric acid esters or salts (e.g. dimethyltartarate, diamonium tartarate, etc.). Polyols that are useful also include polyols which have been reacted with ethylene oxide or other alkylene oxides to provide alkoxylated polyols. Also included are ethers and esters of polyols.

Polyols such as glycoside and polyglycoside compounds including alkoxylated glycosides may be used. A useful polyglycoside is one according to the formula:

$$R_1O—(C_pH_{2p}O)_r—(Z)_x \quad (I)$$

where Z is derived from glucose, $R_1$ is a hydrophobic group selected from alkyl groups, alkylphenyl groups, hydroxyalkylphenyl groups as well as mixtures thereof, wherein the alkyl groups may be straight chained or branched, which contain from 8 to 18 carbon atoms, p is 2 or 3, r is an integer from 0 to 10, and x is a value from 1 to 8.

A further alkyl glycoside is represented by the formula below:

$$R_2O—(R_3O)_y-(G)_xZ_b \quad (II)$$

where $R_2$ is a monovalent organic radical containing from 6 to 30, preferably from 8 to 18 carbon atoms; $R_3$ is a divalent hydrocarbon radical containing from 2 to 4 carbon atoms; 0 is an oxygen atom; y is an integer from 0 to 1; G is a moiety derived from a reducing saccharide containing 5 or 6 carbon atoms; and x is an integer from 1 to 5; Z is $O_2M^1$,

$(III)$ $O(CH_2)$, $CO_2M^1$, $OSO_3M^1$, or $O(CH_2)SO_3M^1$; $R_4$ is $(CH_2)CO_2M^1$ or $CH=CHCO_2M^1$; (with the proviso that Z can be $O_2M^1$ only if Z is in place of a primary hydroxyl group in which the primary hydroxyl-bearing carbon atom, $—CH_2OH$, is oxidized to form a

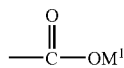

$(IV)$ group); b is a number of from 0 to 3k+1 preferably an average of from 0.5 to 2 per glycosal group; k is an integer of from 1 to 10; $M^1$ is $H^+$ or an organic or inorganic counter-ion, particularly cations such as, for example, an alkali metal cation, ammonium cation, monoethanolamine cation, or calcium cation.

Examples of such alkylglycosides as described above include are APG™ 325 CS Glycoside® which is described as being a 50% $C_9$-$C_{11}$ alkyl polyglycoside, also commonly referred to as D-glucopyranoside, (commercially available from Henkel Corp, Ambler Pa.) and Glucopon™ 625 CS which is described as being a 50% $C_{10}$-$C_{16}$ alkyl polyglycoside, also commonly referred to as a D-glucopyranoside, (available from Henkel Corp., Ambler Pa.).

Exemplary alkyl glycosides suitable for use in the practice of this invention include those represented by the formula:

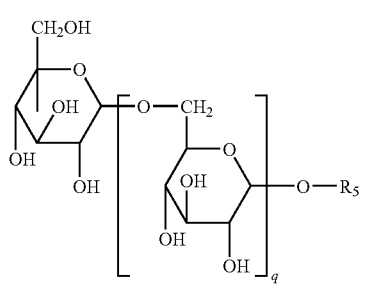

$(V)$ where $R_5$ is an alkyl group, preferably a linear alkyl chain, such as $C_8$ to $C_{16}$ alkyl groups; q is an integer value of from 0-3, inclusive.

Examples of such alkylpolyglycoside compounds according to structure V include: where R is $C_8$ to $C_{10}$ alkyl chains (Glucopon® 220 UP, Glucopon® 225 DK); where R is $C_8$, $C_{10}$, $C_{12}$, $C_{14}$ and $C_{16}$ alkyl chains (Glucopon® 425); where R is $C_{12}$, $C_{14}$ and $C_{16}$ alkyl chains (Glucopon® 600 UP, Glucopon® 625 CSUP, and Glucopon® 625 FE, all of which are available from Henkel Corp., Ambler Pa.). Also useful as the alkylpolyglycoside compound is Triton® CG-110 (Union Carbide Corp.).

Another useful alkylglycoside is GLUCOPON 325N which is described as being a $C_9$-$C_{11}$ alkyl polyglycoside, also commonly referred to as D-glucopyranoside (from Henkel Corp, Ambler Pa.).

Other suitable alkyl polyglycosides that are commercially available include, but are not limited to, GLUCOPON®, or PLANTAREN® surfactants from Henkel Corporation, Ambler, Pa., 19002. Examples of such surfactants include but are not limited to:
1. GLUCOPON® 225 Surfactant—an alkyl polyglycoside in which the alkyl group contains 8 to 10 carbon atoms and having an average degree of polymerization of 1.7.
2. GLUCOPON® 425 Surfactant—an alkyl polyglycoside in which the alkyl group contains 8 to 16 carbon atoms and having an average degree of polymerization of 1.6.
3. GLUCOPON® 625 Surfactant—an alkyl polyglycoside in which the alkyl groups contains 12 to 16 carbon atoms and having an average degree of polymerization of 1.6.

4. APG® 325 Surfactant—an alkyl polyglycoside in which the alkyl groups contains 9 to 11 carbon atoms and having an average degree of polymerization of 1.6.
5. GLUCOPON® 600 Surfactant—an alkyl polyglycoside in which the alkyl groups contains 12 to 16 carbon atoms and having an average degree of polymerization of 1.4.
6. PLANTAREN® 2000 Surfactant—a $C_{8-16}$ alkyl polyglycoside in which the alkyl group contains 8 to 16 carbon atoms and having an average degree of polymerization of 1.4.
7. PLANTAREN® 1300 Surfactant a $C_{12-16}$ alkyl polyglycoside in which the alkyl groups contains 12 to 16 carbon atoms and having an average degree of polymerization of 1.6.

Other suitable polyols include, but are not limited to, alcohol alkoxylates, fatty alcohol alkoxylates, fatty sorbitan esters and their alkoxylates, and the like. Examples of two commercially available surfactants are the ethylene oxide and propylene oxide surfactants Pluronic® and Tetronic® (obtainable from BASF).

Additional surfactants include, but are not limited to, surfactants having the following general formula:

(VI)

where R' is a ($C_1$ to $C_6$) alky or ($C_6$ to $C_{14}$) aryl group, G is a carboxyl, sulfonyl, or phosphonyl, M is a charge-balancing cation such as sodium, potassium, or ammonium, and u is an integer of from 1 to 200, preferably an integer of from 2 to 200. When u is an integer of 2 or greater, $G_1$ is the same or different. An example of such surfactants is Newkalgen® TX-C (obtainable from Takemoto Oil and Fat Co.) which is a phenolic sulfonyl salt.

Another class of surfactants which may be included in the cleaning compositions is the gemini surfactant. A gemini surfactant (GS) includes two conventional surfactant molecules chemically bonded together by a spacer. Two terminal hydrocarbon tails may be short or long; two polar head groups may be cationic, anionic or nonionic. The spacer may be short or long, flexible or rigid. The GS need not be symmetrically disposed about the center of the spacer. The hydrophilic and hydrophobic groups of each surfactant moiety may be any of those known to be used in conventional surfactants having one hydrophilic group and one hydrophobic group. For example, a typical nonionic gemini surfactant, e.g., a bis-polyoxyethylene alkyl ether, may contain two polyoxyethylene alkyl ether moieties. One type of gemini surfactant which may be included in the cleaning compositions are the nonionic gemini surfactants disclosed in U.S. Pat. No. 5,945,393.

Optional antifoam agents also may be used in the cleaning compositions. Such antifoam agents include, but are not limited to, silicon compounds such as siloxanes with glycols, acetylenics and block alkoxy copolymers. Other conventional antifoam agents may be used depending on the specific type of surfactant or combination of surfactants in the cleaning compositions. Workers may use routine experimentation to determine which antifoam agents are suitable for a particular surfactant or combination of surfactants.

Although both the aqueous acid and aqueous alkaline cleaning compositions may include one or more optional antifoam agents, the aqueous acid cleaning compositions consist essentially of one or more polycarboxylic acid, one or more surfactants and water; and the aqueous alkaline cleaning compositions consist essentially of one or more alkaline compound, one or more surfactants and water. Typically, the surfactant is a nonionic surfactant such as a polyol, such as an alkyl polyglycoside or a nonionic gemini surfactant.

Optionally, after the aqueous alkaline cleaning step the wafer may be cleaned with a second acid cleaning step. The optional acid cleaning step is a repeat of the first acid cleaning step. The optional acid cleaning step removes any remaining metals which were not removed in the first acid cleaning step and the alkaline cleaning step.

The following Examples are intended to further illustrate the invention but are not intended to limit the scope of the invention.

Example 1

A monocrystalline silicon ingot was bonded to a contact plate and an attachment jig. This was loaded on a conventional wire saw apparatus. The wire saw was coated with abrasive silicon carbide particles. During cutting a slurry containing polyethylene glycol and #600 to #1000 size silicon carbide particles in a weight ratio of 1:1 was sprayed from slurry nozzles of the apparatus onto the ingot. The monocrystalline silicon wafers which were cut from the ingot were then cleaned for 10 minutes at room temperature with a 5 wt % aqueous alkaline composition made from a concentrate composed of 0.05 wt % Glucopon™ 425N, 6.25 wt % sodium carbonate, 17.5 wt % sodium hydroxide and 76.2 wt % water. Cleaning was done by spraying the wafers with the aqueous alkaline composition using a conventional spraying apparatus.

After cleaning, the silicon wafers were analyzed for metal contaminants from the cutting process by abstraction with 10% nitric acid mixture at room temperature for 2 minutes and then conventional atomic absorption spectroscopy using a Varian Graphite Furnace AA 2807 Zeeman Atomic Absorption Spectrophotometer. The metal contaminants measured were copper at 1.26 ppb, iron at 1.53 ppb, lead at 0.32 ppb and zinc at 1.77 ppb.

Example 2

A monocrystalline silicon ingot was bonded to a contact plate and an attachment jig. This was loaded on a conventional wire saw apparatus. The wire saw was coated with abrasive silicon carbide particles. During cutting a slurry containing polyethylene glycol and #600 to #1000 size silicon carbide particles in a weight ratio of 1:1 was sprayed from slurry nozzles of the apparatus onto the ingot. The monocrystalline silicon wafers which were cut from the ingot were then cleaned for 5 minutes at room temperature with a 5 wt % aqueous acid composition made from a concentrate composed of 0.025 wt % Glucopon™ 425N, 10 wt % oxalic acid and the balance water. The aqueous acid composition was applied to the wafers by a conventional spraying apparatus. Immediately after cleaning with the aqueous acid composition the wafers were spray cleaned with the aqueous alkaline composition used in Example 1. Cleaning with the aqueous alkaline composition was done for 10 minutes.

After cleaning, the silicon wafers were analyzed for metal contaminants by the same procedure as in Example 1. The metal contaminants measured were copper at 0.22 ppb, iron at 0.6 ppb, lead at 0 ppb and zinc at 0.53 ppb. The aqueous acid composition followed by application of the aqueous alkaline composition removed significantly more metal residues than the aqueous alkaline composition in Example 1.

Example 3

A monocrystalline silicon ingot was bonded to a contact plate and an attachment jig. This was loaded on a conventional wire saw apparatus. The wire saw was coated with abrasive silicon carbide particles. During cutting a slurry containing polyethylene glycol and #600 to #1000 size silicon carbide particles in a weight ratio of 1:1 was sprayed from slurry nozzles of the apparatus onto the ingot. The monocrystalline silicon wafers which were cut from the ingot were then cleaned for 5 minutes at room temperature with a 5 wt % aqueous acid composition made from a concentrate composed of 0.025 wt % Glucopon™ 425N, 10 wt % oxalic acid and the balance water. The aqueous acid composition was applied to the wafers by a conventional spraying apparatus. Immediately after cleaning with the aqueous acid composition the wafers were spray cleaned with the aqueous alkaline composition used in Example 1. Cleaning with the aqueous alkaline composition was done for 10 minutes. Immediately after cleaning with the aqueous alkaline composition the wafers were cleaned again for 5 minutes using the aqueous acid composition.

After cleaning, the silicon wafers were analyzed for metal contaminants from the cutting process as in Example 1. The metal contaminants measured were copper at 0.2 ppb, iron at 0.3 ppb, lead at 0 ppb and zinc at 0.38 ppb. The aqueous acid composition followed by application of the aqueous alkaline composition and then followed by cleaning with the acid cleaner a second time further reduced metal residues.

Example 4

A polycrystalline silicon ingot is bonded to a contact plate and an attachment jig. This is loaded on a conventional wire saw apparatus. The wire saw is coated with diamond abrasive particles. During cutting a slurry containing mineral oil and #600 to 1000# size silicon carbide particles in a weight ratio of 1:1 is sprayed from slurry nozzles of the apparatus onto the ingot. The polycrystalline silicon wafers which are cut from the ingot are then cleaned for 5 minutes at room temperature with a 5 wt % aqueous acid composition made from a concentrate composed of 0.025 wt % Glucopon™ 625, 10 wt % citric acid and the balance water. The aqueous acid composition is applied to the wafers by a conventional spraying apparatus at 50° C. Immediately after cleaning with the aqueous acid composition the wafers are spray cleaned with a 5 wt % aqueous alkaline composition made from a concentrate containing 0.05 wt % Glucopon™ 625, 6 wt % sodium carbonate with the balance water. Cleaning with the aqueous alkaline composition is done for 10 minutes.

After cleaning, the silicon wafers are analyzed as in Example 1 for metal contaminants from the cutting process. The metal contaminants such as copper, iron, lead and zinc are each expected to be in amounts of less than 1 ppb.

What is claimed is:

1. A method comprising, in sequence, the following:
   a) applying an aqueous acid composition comprising one or more acids chosen from polycarboxylic acids and inorganic acids to a semiconductor wafer; and
   b) applying an aqueous alkaline composition consisting of one or more alkaline compounds selected from the group consisting of sodium hydroxide, potassium hydroxide, sodium carbonate, potassium carbonate, sodium bicarbonate and tetra-methyl ammonium hydroxide, one or more polyglycosides or one or more glycosides or mixtures thereof, water and optionally, one or more additional surfactants to the semiconductor wafer to remove metals and residue from the semiconductor wafer.

2. The method of claim 1, further comprising a step of applying a second acid composition comprising one or more acids chosen from polycarboxylic acids and inorganic acids to the semiconductor wafer subsequent to step b.

3. The method of claim 1, wherein the aqueous acid composition further comprises one or more surfactants.

4. The method of claim 3, wherein the one or more surfactants are nonionic.

5. The method of claim 4, wherein the nonionic surfactant is chosen from a polyol and a gemini surfactant.

6. The method of claim 5, wherein the polyol is chosen from a glycoside and a polyglycoside.

7. The method of claim 1, wherein the polycarboxylic acid is chosen from a dicarboxylic acid, a tricarboxylic acid and an oxycarboxylic acid.

8. The method of claim 1, wherein the semiconductor wafer is a monocrystalline or polycrystalline silicon.

* * * * *